United States Patent
Wilfer

(10) Patent No.: US 11,217,729 B2
(45) Date of Patent: Jan. 4, 2022

(54) LED COVERING ELEMENT

(71) Applicant: Hans-Peter Wilfer, Markneukirchen (DE)

(72) Inventor: Hans-Peter Wilfer, Markneukirchen (DE)

(*) Notice: Subject to any disclaimer, the term of this patent is extended or adjusted under 35 U.S.C. 154(b) by 59 days.

(21) Appl. No.: 16/738,645

(22) Filed: Jan. 9, 2020

(65) Prior Publication Data

US 2020/0227596 A1 Jul. 16, 2020

(30) Foreign Application Priority Data

Jan. 10, 2019 (DE) .......................... 102019100527.2

(51) Int. Cl.
*H01L 33/48* (2010.01)
*G10H 1/34* (2006.01)

(52) U.S. Cl.
CPC .......... *H01L 33/483* (2013.01); *G10H 1/348* (2013.01)

(58) Field of Classification Search
CPC ...... H01L 33/483; G10H 1/348; F21V 19/002
See application file for complete search history.

(56) References Cited

U.S. PATENT DOCUMENTS

| 2008/0031009 A1* | 2/2008 | Kodaira | H01L 33/58 362/612 |
| 2008/0212319 A1* | 9/2008 | Klipstein | B60Q 3/35 362/231 |
| 2010/0062064 A1* | 3/2010 | Ault | A61K 31/4439 424/475 |
| 2010/0109499 A1* | 5/2010 | Vilgiate | F21V 29/773 313/1 |
| 2017/0124997 A1 | 5/2017 | Blaschke et al. | |

FOREIGN PATENT DOCUMENTS

| DE | 202009001286 U1 | 6/2009 |
| DE | 102008039364 A1 | 3/2010 |
| DE | 102015118583 A1 | 10/2015 |

* cited by examiner

*Primary Examiner* — Jay C Chang
*Assistant Examiner* — Mikka Liu
(74) *Attorney, Agent, or Firm* — Libby Babu Varghase; Scarinci Hollenbeck

(57) ABSTRACT

A covering element for covering an LED installed in a planar device surface, comprising a one- or multipart emitting body as well as a circumferential fastening web connected to the one- or multipart emitting body, wherein a receiving space is formed between the fastening web and the emitting body, into which an LED projecting over the device surface can dip.

15 Claims, 1 Drawing Sheet

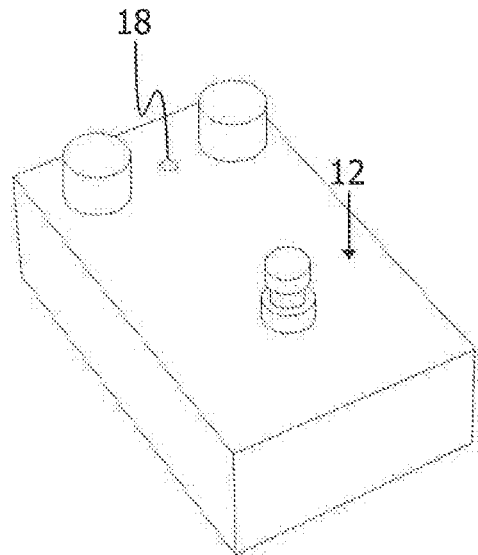
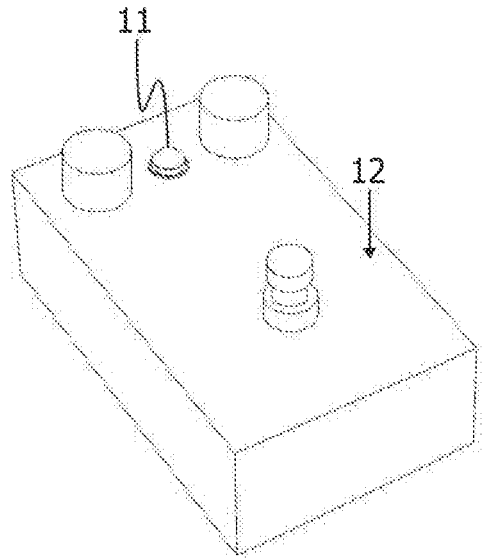
Fig. 1a
Prior art
Fig. 1b
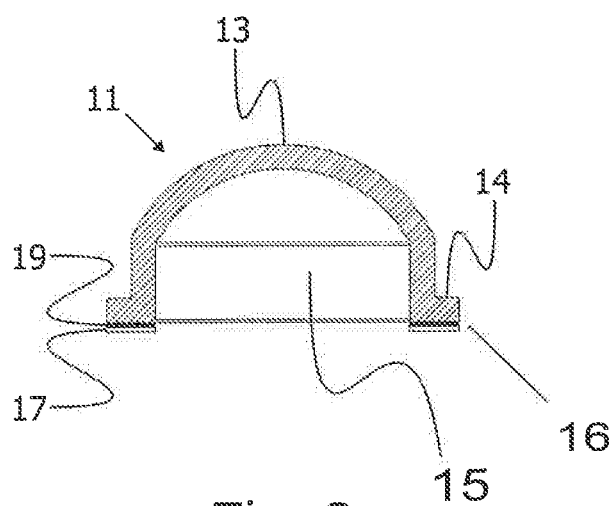
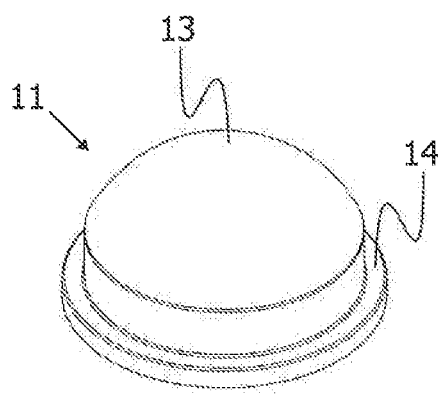
Fig. 2
Fig. 3

LED COVERING ELEMENT

FOREIGN PRIORITY CLAIM

This application is based upon and claims the benefit of priority from the prior German patent application number DE102019100527.2, filed on Jan. 10, 2020, the entire contents of which are incorporated herein by reference.

FIELD OF THE INVENTION

The present disclosure is directed to a covering element for covering an LED installed in a planar device surface.

BACKGROUND OF THE INVENTION

Light-emitting diodes used nowadays, hereinafter LEDs, are characterized by a high degree of emitted light energy which brings with it considerable advantages in numerous areas of technology. In part, however such light-intensive LEDs are also installed in applications in which, in principle, a lower light emission would be desired. In certain application environments, for example, in stage presentations, intensively emitting LEDs can even have a perturbing effect.

One possibility in this case would be to disconnect the relevant LED from the power supply. However, this frequently requires considerable interventions in the corresponding devices in which the LED is installed. Furthermore, an information function is frequently connected to an LED installed in such a manner in a device surface, for example, that the appropriate device is ready to operate. If the LED were now to be completely disconnected from the electric circuit, this information function would no longer be ensured.

What is desired is an invention that provides a solution for this so that on the one hand, the display function of such an LED is maintained but on the other hand, the appreciable emission of the LED installed in the device surface no longer has a perturbing effect. What is also desired is a covering element for covering an LED installed in a planar device surface.

SUMMARY OF THE INVENTION

An LED covering element is provided for covering an LED installed in a planar device surface, wherein the covering element comprises a one- or multipart emitting body as well as a circumferential fastening web connected to the one- or multipart emitting body, wherein a receiving space is formed between the fastening web and the emitting body, into which an LED projecting over the device surface can dip. The emitting body is selected in this case so that the dazzling effect of the energized LED is no longer achieved, in this case, the emitting body ensures at least one of the two following functions, usually a combination of the two functions should be present: on the one hand, only a part of the light emitted by the LED is transmitted at all through the emitting body, on the other hand a considerable proportion of the transmitted light is scattered during transmission so that a dazzling effect is no longer achieved but at the same time it can be identified whether the emitting body is illuminated or not illuminated.

In one embodiment, the emitting body directly adjoins the circumferential fastening web. Alternatively, it would also be possible to provide initially a light-impermeable, preferably circumferential section adjacent to the circumferential fastening web and only provide an emitting body adjacent to the light-impermeable section.

In another embodiment, the covering element has a basic shape approximating to a spherical dome, wherein other shapes are also possible.

In yet another embodiment, a preferably circumferential adhesive surface is formed on the circumferential fastening web on its side facing away from the emitting body in order to be able to fasten the covering element on a device surface. The adhesive surface can, for example, be sealed with a covering film so that after removing the covering film, a user can place and fasten the covering element over the LED installed in the device surface. A particularly rapid, convenient and reliable fastening of the covering element on different device surfaces is made possible as a result.

In another embodiment, at least the emitting body of the covering element, preferably also the circumferential fastening web is formed from plastic. Plastic is particularly suitable for the desired function here since there are numerous plastics which have good light-absorbing and light-scattering properties. A covering element made of plastic can furthermore also be mass-produced cost-effectively. A possible preferred plastic material is, for example, polycarbonate. Preferably material and thickness of the plastic in the region of the emitting body are selected so that the ratio of emitted light to light passing through the emitting body (transmissivity) having the wavelength 640 nm lies in a range from 10% to 60%.

In another embodiment, a device, such as a planar device, has a planar device surface with an LED installed, which is covered with a covering element according to the present invention.

DESCRIPTION OF THE DRAWINGS

FIG. 1a shows a prior art device surface provided with an LED.

FIG. 1b shows the prior art device of FIG. 1a with a covering element according to the present invention, which is covering the LED of the device.

FIG. 2 shows a cutaway view of an embodiment of a covering element according to the present invention.

FIG. 3 shows a perspective view of the covering element according to FIG. 2.

DETAILED DESCRIPTION OF THE INVENTION

FIGS. 1a and 1b show a typical application for the covering element 11 according to the present invention. FIG. 1a shows the prior art, a device with a device surface 12 such as, but not limited to, an effect device or an effect pedal. Such effect devices are used in musical stage presentations in connection with electric guitars or electric bass guitars in order to modify the sound in a desired manner. An LED 18 serves as a display element for a specific operating mode, for example, that the effect device per se is ready to function or that an influencing of sound is specifically carried out by the effect device. However, the emission of the LED 18 is perturbing specifically when the stage is darkened. For this purpose, a covering element 11 according to the invention is proposed which, as can be seen from FIG. 1b, is fixed on the device surface 12 covering the LED 18.

The covering element 11 itself is now explained further in more detail with reference to FIGS. 2 and 3. In the present embodiment, the covering element 11 has a substantially spherical-dome-shaped, approximately hemispherical shape, wherein shapes differing from this are also feasible. An element of the covering element 11 is the emitting body 13 which serves to let through the emission of the LED in an attenuated manner, i.e. to bring about a light attenuation and/or scattering of the LED located thereunder.

For fastening the covering element 11 on the device surface 12, a circumferential fastening web 14 is provided. See FIG. 3. The spherical-dome-shaped covering body 13 here directly adjoins the circumferential fastening web 14 which is here configured to be annular. The annular fastening web 14 and the spherical-dome-shaped emitting body 13 are formed in one piece from plastic, in the present embodiment. The plastic, in the present case, may be a polycarbonate.

In order to facilitate the fastening of the covering element 11 on the device surface 12, the fastening web 14 can have an adhesive surface 16 on the side facing away from the emitting body 13, which is already provided with an adhesive layer 19, wherein the adhesive layer 19 is initially sealed with a covering film 17 which should be removed by a user directly before application of the covering element to the device surface, so that the covering element 11 can then be fastened to the device surface 12 via the adhesive layer 19.

The covering element 11 comprises an emitting body 13 directly adjoined or affixed to the fastening web 14. The fastening web has a top side, which is the side facing the emitting body, and an underside, which is the side facing away from the emitting body. An adhesive or other fastenable material is disposed on the fastening web, specifically on the side facing away from the emitting body. The covering element 11 is fastenable to a device surface 12 by the fastening material disposed on the underside (the side facing away from the emitting body) of the fastening web 14. A receiving space 15 is defined by the emitting body 13 adjoined to the fastening web 14. The receiving space is dimensioned and configured to an LED on the planar device surface (12) such that the LED can dip into the receiving space 15.

Although the present invention has been described here, for example, in the field of stage presentations, in particular in connection with effect devices for electric guitars and electric bass guitars, other applications are also feasible, for example, in the household. Here also many items of equipment now have strongly emitting LEDs which can constitute a perturbing light source in particular in bedrooms or children's rooms. The covering element proposed here forms a simple and reliable means to maintain the function of such LEDs on the one hand but to eliminate the interfering dazzle effect on the other hand.

While specific embodiments of the invention have been described and illustrated, such embodiments should be considered illustrative of the invention only and not as limiting the invention as construed in accordance with the accompanying claims. One of ordinary skill in the art could alter the above embodiments or provide insubstantial changes that may be made without departing from the scope of the invention.

I claim:

1. A covering element for covering a Light-emitting diode on a planar device surface comprising an emitting body (13), said emitting body formed from a light-absorbing and light-scattering plastic and a fastening web (14) connected to the emitting body (13), wherein a receiving space (15) is formed between the fastening web (14) and the emitting body (13), wherein said receiving space (15) is dimensioned and configured to receive the Light-emitting diode (18) projecting over the planar device surface (12), wherein light is permitted through the emitting body at a ratio of emitted light to transmissivity through the emitting body, wherein a range of 10% to 60% of said light is permitted through the emitting body.

2. The covering element according to claim 1, wherein the emitting body (13) directly adjoins the fastening web (14).

3. The covering element according to claim 1, wherein an adhesive (16) is disposed on the fastening web (14), said adhesive (16) is on a side of the fastening web (14) facing away from the emitting body (13).

4. The covering element according to claim 1, wherein the emitting body (13) is made of polycarbonate.

5. The covering element according to claim 4, wherein the plastic has a thickness, said plastic thickness permits passage of 10% to 60% of a 640 nm wavelength of light through the emitting body (13) relative to a ratio of emitted light to transmissivity through the emitting body (13).

6. The covering element according to claim 1, wherein the fastening web (14) is formed from plastic.

7. The covering element according to claim 1, wherein the fastening web (14), is made of polycarbonate.

8. The covering element according to claim 1, wherein said light is at a 640 nm wavelength.

9. An effect device having an Light-emitting diode (18) disposed on a planar device surface (12) of said effect device having a covering element (11), wherein the covering element has an emitting body (13), said emitting body (13) formed from a light-absorbing and light-scattering plastic and a fastening web (14) connected to the emitting body (13), wherein a receiving space (15) is formed between the fastening web (14) and the emitting body (13), wherein said receiving space (15) is dimensioned and configured to receive the Light-emitting diode (18) projecting over the planar device surface (12) wherein the plastic of the emitting body (13) permits passage of 10% to 60% of a 640 nm wavelength of light through the emitting body (13) relative to a ratio of emitted light to transmissivity through the emitting body (13).

10. The covering element according to claim 9, wherein the emitting body (13) directly adjoins the fastening web (14).

11. The covering element according to claim 9, wherein an adhesive (16) is disposed on the fastening web (14), said adhesive (16) is on a side of the fastening web (14) facing away from the emitting body (13).

12. The covering element according to claim 9, wherein the plastic is made of polycarbonate.

13. The covering element according to claim 9, wherein the fastening web (14) is made of polycarbonate.

14. A covering element (11) comprises
   a hollow dome-shaped emitting body (13) directly adjoined to
   an annular fastening web (14), and
   a receiving space (15) defined by the hollow dome-shaped emitting body (13) adjoined to the annular fastening web (14), wherein the hollow dome-shaped emitting body (13) and the annular fastening web (14) are configured as one-piece, wherein the annular fastening web is configured to be attached to an effect pedal device surface (12), wherein the receiving space (15) is dimensioned and configured to an effect pedal Light-emitting diode on the effect pedal device surface (12) such that the effect pedal Light-emitting diode dips into the receiving space (15).

15. The covering element (11) according to claim 14, wherein a fastenable material is disposed on n underside of the fastening web.

* * * * *